(12) United States Patent
Cheah et al.

(10) Patent No.: US 11,527,463 B2
(45) Date of Patent: Dec. 13, 2022

(54) HYBRID BALL GRID ARRAY PACKAGE FOR HIGH SPEED INTERCONNECTS

(71) Applicant: Intel Corporation, Santa Clara, CA (US)

(72) Inventors: Bok Eng Cheah, Gelugor Pulau Pinang (MY); Jenny Shio Yin Ong, Bayan Lepas Pulau Pinang (MY); Seok Ling Lim, Kulim Kedah (MY); Kooi Chi Ooi, Gelugor Pulau Pinang (MY); Jackson Chung Peng Kong, Tanjung Tokong Pulau Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 42 days.

(21) Appl. No.: 16/984,173

(22) Filed: Aug. 4, 2020

(65) Prior Publication Data
US 2021/0375735 A1 Dec. 2, 2021

(30) Foreign Application Priority Data
May 27, 2020 (MY) .............................. PI2020002630

(51) Int. Cl.
*H01L 23/498* (2006.01)
*H01L 21/48* (2006.01)
*H01L 23/522* (2006.01)

(52) U.S. Cl.
CPC ...... *H01L 23/49816* (2013.01); *H01L 21/485* (2013.01); *H01L 21/4853* (2013.01); *H01L 23/5226* (2013.01)

(58) Field of Classification Search
CPC ......... H01L 23/49811; H01L 23/49827; H01L 23/49816; H01L 23/5226; H01L 25/0657; H01L 21/485; H01L 21/4583
See application file for complete search history.

(56) References Cited

U.S. PATENT DOCUMENTS

| | | | | |
|---|---|---|---|---|
| 10,879,203 B2* | 12/2020 | Chen | .................. | H01L 24/73 |
| 2007/0007665 A1* | 1/2007 | Clevenger | ............... | H01L 23/13 |
| | | | | 257/E21.511 |
| 2011/0215360 A1* | 9/2011 | Wang | ..................... | H01L 24/17 |
| | | | | 257/E33.056 |
| 2013/0026630 A1* | 1/2013 | Low | ......................... | H01L 24/17 |
| | | | | 257/738 |
| 2013/0087909 A1* | 4/2013 | Abdul Razak | .......... | H01L 24/14 |
| | | | | 257/737 |
| 2013/0087910 A1* | 4/2013 | Abdul Razak | .......... | H01L 24/14 |
| | | | | 257/737 |
| 2014/0353836 A1* | 12/2014 | O'Sullivan | ............. | H01L 24/19 |
| | | | | 257/773 |
| 2018/0226334 A1* | 8/2018 | Sankman | .......... | H01L 23/49894 |
| 2020/0013744 A1* | 1/2020 | Hsieh | ................... | H05K 3/3436 |
| 2021/0384135 A1* | 12/2021 | Kuan | ................... | H01L 23/5384 |

* cited by examiner

*Primary Examiner* — Jaehwan Oh
*Assistant Examiner* — John M Parker
(74) *Attorney, Agent, or Firm* — Viering, Jentschura & Partner MBB (57) ABSTRACT

According to various examples, a semiconductor package is described including a substrate raiser with interconnect vias that may be positioned on the bottom side of a substrate and mini solder balls positioned on the interconnect vias and a plurality of large solder balls positioned on the bottom side of the substrate adjacent to the substrate raiser, wherein the mini solder balls and the large solder balls extend approximately a same height from the substrate for mounting on a printed circuit board.

18 Claims, 7 Drawing Sheets

HYBRID BALL GRID ARRAY PACKAGE FOR HIGH SPEED INTERCONNECTS

CROSS-REFERENCE TO RELATED APPLICATIONS

This application claims priority to Malaysian Patent Application PI2020002630, which was filed on May 27, 2020, the contents of which are hereby full incorporated herein by reference.

BACKGROUND

With continued miniaturization using conventional semiconductor packaging, there are growing concerns with signal integrity (i.e. electrical insertion loss) associated with the package-to-printed circuit board (PCB) vertical interconnects, especially for high-speed (>40 GHz) applications. These packages are provided with substrates for mechanical support and as electrical interfaces or connections to access the devices on the mounted dies, and are electrically connected to PCB using solder balls.

A signal transferred through a transmission line to a mismatched load impedance may result in continuously reflected signals. For example, multiple signal reflections may occur along the vertical interconnect path, including the conductive vias and solder balls, due to impedance discontinuities that cause increased return losses that may lead to overall channel insertion loss. Energy losses along transmission lines may cause signal integrity degradation that can impact the functionality of high data-rate applications, e.g., serial de-serial (SerDes) buses operating at 56 GHz (Nyquist frequency).

Among the current approaches to mitigating channel return and/or insertion losses, these include: (i) reduction of package plated-through-hole (PTH) dimension, e.g., smaller diameter and increased anti-pad geometry (an insulating gap between PTH cap and adjacent reference plane) to address over-capacitive PTH structures; (ii) reduction of ball grid array (BGA) dimension for capacitance reduction; and (iii) increasing the channel impedance closer to the target impedance.

Each of these approaches have drawbacks—for example, reducing PTH dimensions (i.e., increasing PTH aspect ratio) may require increased plating processing and its associated reliability risks; enlarging anti-pad geometry may lead to undesirable routing-over-void (ROV) phenomena caused by the reference plane for the transmission line being distorted, and BGA geometry reduction poses limitations on the maximum current carrying capacity ($I_{max}$) of each BGA for power delivery to the silicon device(s) e.g. CPU and/or graphic cores and package-to-PCB interconnect reliability.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a semiconductor package that may have a substrate, a substrate raiser positioned on the substrate, the substrate raiser that may have one or more conductive via, a first solder ball or mini solder ball that may be positioned atop and coupled to the conductive via, and one or more second solder ball or large solder ball that may be positioned on the substrate, wherein the first solder ball and the second solder ball are sized to form a level planar connection surface.

In various aspects, the substrate raiser has a step section that may have a plurality of smaller conductive vias and a semiconductor device coupled to at least one smaller conductive vias. In further aspects, a height of the semiconductor device and the at least one smaller conductive via coupled together may be less than a height of the first solder ball or mini solder ball and the at least one conductive via.

The technical effects of the present disclosure may include improved electrical performance from greater signal integrity due to reduced electrical insertion losses and improved impedance matching across the package substrate and printed circuit board (PCB); in particular, reducing electrical insertion loss in the vertical interconnects used for package-to-PCB for high-speed (>40 GHz) applications.

The use of a ball grid array (BGA) is a common surface-mount packaging approach for integrated circuits. According to the various aspects of the present disclosure, the effects may be achieved through the use of a "substrate raiser", which is an elevated or raised section of the substrate, that may be formed on the substrate in the space between the substrate and the PCB that enables a reduced-sized or "mini" ball geometry to form a "hybrid" BGA semiconductor package, i.e., using a substrate raiser and solder balls of different sizes. The terms hybrid BGA semiconductor package and present semiconductor package are used interchangeably in the present disclosure.

To more readily understand and put into practical effect the present semiconductor package, particular aspects will now be described by way of examples and not limitations, and with reference to the figures. For the sake of brevity, duplicate descriptions of features and properties may be omitted.

Figure 1:
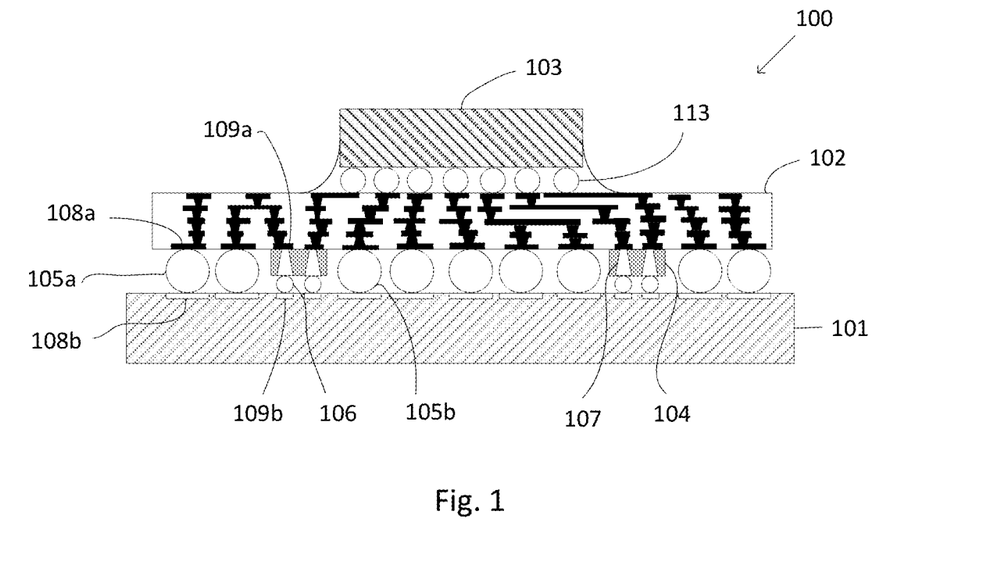
FIG. 1 shows a cross-sectional view of a semiconductor package according to an aspect of the present disclosure.

In the aspect shown in FIG. 1, a cross-sectional view of a hybrid BGA semiconductor package 100 may have a PCB 101, a substrate 102, a mounted die 103 and a substrate raiser 104, which may be positioned in the space between the PCB 101 and the substrate 102. The cross-section is taken along the A-A' line of FIG. 1A. The substrate raiser 104 may have two interconnect vias 107. The height of the interconnect vias 107 may be substantially the same as the height of the substrate raiser 104. In an aspect, the substrate raiser 104 and the interconnect vias 107 may have a height (or thickness) ranging from approximately 50 micro-meter (μm) to 200 μm. The die 103 may be a CPU or other IC chip and may be electrically coupled to the substrate 102 by "die-side" solder bumps 113.

As shown in FIG. 1, the substrate 102 may be a coreless substrate. A coreless substrate package has no core layer, which is typically made of glass cloth and resin layers, and may lead to a further miniaturized form-factor and improved electrical performance due to reduced package stack-up geometry, minimized impedance discontinuities and signal return losses. In alternative aspects of the present disclosure, the substrate for the package may include one or more rigid core layer for improved mechanical performance, i.e., high rigidity for improved package substrate warpage control.

In addition, the hybrid BGA semiconductor package 100 may have large solder balls 105a and 105b, which may be positioned adjacent to the substrate raiser 104 between the PCB 101 and the substrate 102, and mini solder balls 106, which may be positioned between the PCB 101 and the interconnect vias 107. In an aspect of the present disclosure, the mini solder balls may have a height ranging from approximately 25 μm to 100 μm.

Also, as shown in FIG. 1, the large solder balls 105a and 105b may have contact or landing pads 108a on the substrate 102 and 108b on the PCB 101. The interconnect vias 107 may have contact pads 109a on the substrate 101 and the mini solder balls 106 may have contact pads 109b on the PCB 101. In an aspect, a mini solder ball may be disposed directly on a contact pad on the PCB that is adjacent to the contact pad for a large solder ball. In another aspect, a contact pad for a mini solder ball may have a smaller dimension than a contact pad for a large solder ball. In yet another aspect, a contact pad for a mini solder ball and/or a large solder ball may be coupled to at least one die through a plurality of package traces and vertical vias in the substrate.

The large solder balls 105a and 105b may be sized to have a height that may be substantially the same as the combined height of the interconnect vias 107 and the mini solder balls 106 to form a level planar surface with the mini solder balls 106 for ease of coupling with the PCB 101. Accordingly, for example, if the mini solder balls may have a height of approximately 25 μm and the interconnect vias may have a height of approximately 50 μm, then large solder balls may be sized to have a height of approximately 75 μm.

Figure 1A:
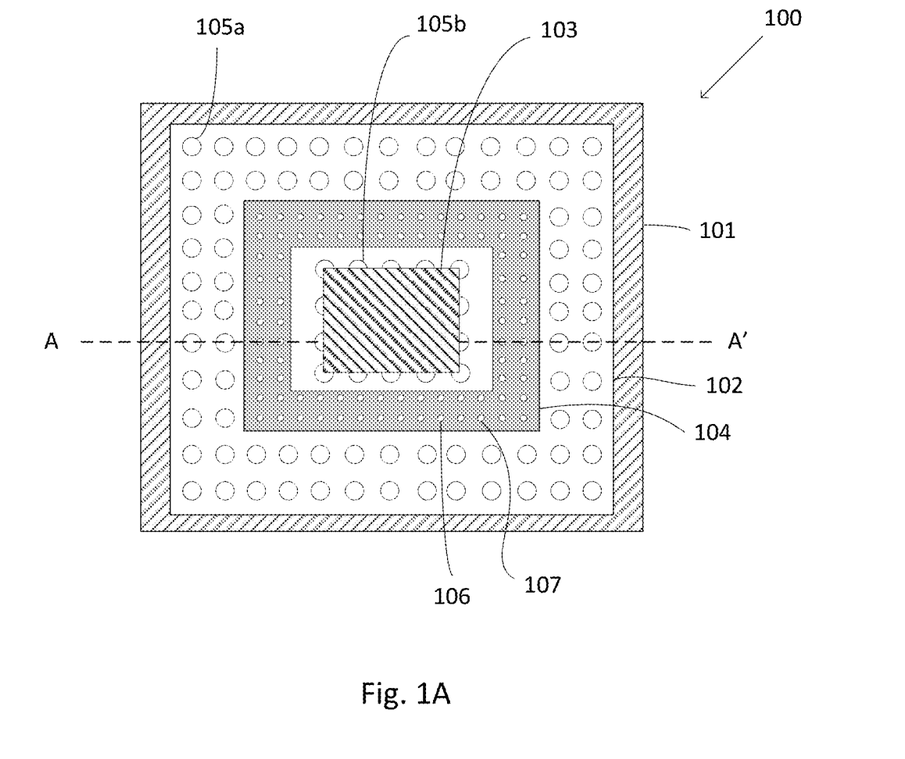
FIG. 1A shows a top view layout of the semiconductor package according to the aspect as shown in FIG. 1.

In FIG. 1A, a top view layout of the semiconductor package according to the aspect in FIG. 1 is shown. The substrate raiser 104 may be positioned outside the footprint of the die 103. According to various aspects of the present disclosure, the substrate raiser 104 may form at least a partial perimeter or frame around the periphery of the die 103. For the aspect shown in FIG. 1A, the substrate raiser 104 forms a complete perimeter around the die 103, the array of large solder balls 105a are outside of the perimeter formed by substrate raiser 104 and large solder balls 105b are inside of the perimeter.

According to an aspect of the present disclosure, the mini solder balls 106 may carry electrical or differential signals operating at greater than 40 GHz, e.g., for a SerDes interface operating at 56 GHz. In another aspect, the large solder balls 105a and 105b may carry electrical or differential signals operating less than 40 GHz, e.g., for a single-ended memory bus ranging from 1.6 GHz to 4.25 GHz, or for a USB3.1 operating at 10 GHz. In yet another aspect, the large solder ball 105b may carry power supply voltage to the die 103. These different electrical pathways for different types of applications according to the present disclosure may provide for increased signal integrity.

Furthermore, according to various aspects of the present disclosure, the width of the substrate raiser may be determined based on the number of interconnect vias required for a particular package design. As shown in FIG. 1A, the substrate raiser 104 may have a width that accommodates two rows of interconnect vias 107, whereas a wider substrate raiser may accommodate more than two rows of interconnect vias.

Figure 2:
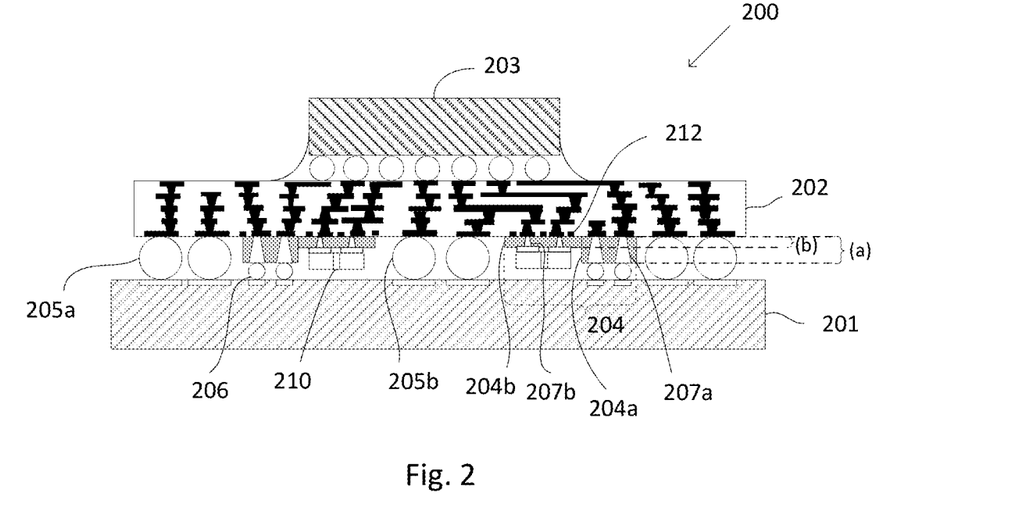
FIG. 2 shows a cross-sectional view of a semiconductor package with passive devices positioned on the bottom side of the substrate according to another aspect of the present disclosure.

As shown in FIG. 2, a cross-sectional view of an aspect of the present semiconductor package 200 that may have a PCB 201, a substrate 202, a mounted die 203 and a substrate raiser 204, including an upper step portion or section 204a and a lower step portion or section 204b, which may be positioned in the space between the PCB 201 and the substrate 202. The cross-section is taken along the A-A' line of FIG. 2A. The substrate raiser 204 may have four interconnect vias 207a and 207b, with the interconnect vias 207a being located on the upper step section 204a and the interconnect vias 207b being located on lower step section 204b. The substrate raiser 204 may have a height shown as (a) and the step section 204b may have a height shown as (b), which is less than the height (a) for the substrate raiser 204.

According to various aspects, the lower step section 204b may accommodate various semiconductor components, including passive devices. The lower step section 204b may provide a support surface for connecting one or more passive devices 210 to the die 203 or PCB 201 and, accordingly, may have a corresponding number of interconnect vias 207b for each such passive device. For example, the passive devices may include capacitors, resistors, inductors, transformers, and some diodes, as being within the scope of the present disclosure. In an aspect of the present disclosure, the passive device may be a decoupling capacitor; specifically, it may be a ceramic or silicon capacitor.

Figure 3:
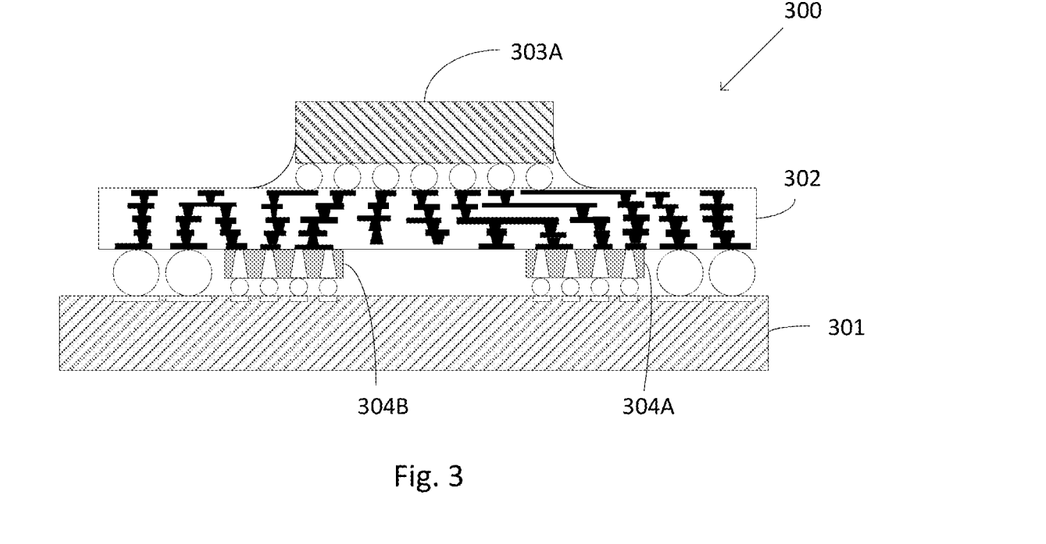
FIG. 3 shows a cross-sectional view of a semiconductor package with two dies according to a further aspect of the present disclosure.

A lower step section of the substrate raiser may be positioned on the interior side or infield area towards the center of the substrate; for example, as shown in FIG. 2, the lower step section 204b may be positioned substantially under the die 203. It is within the scope of the present disclosure to position a lower step section on the exterior side, towards the periphery of the substrate, in order to achieve a desired stacked structure design. Moreover, it is within the scope of the present disclosure to have a substrate raiser with two or more step sections to achieve complex stacked structure designs. Also, in various other aspects, a substrate raiser may be formed as different patterns, e.g., as shown in FIG. 3, and a lower step section may be included with such patterned substrate raisers.

In another aspect of the present disclosure, the BGA may have large solder balls 205a and 205b that may be sized to a height that may be substantially the same as the combined height of the interconnect vias 207a and the mini solder balls 206, and thereby form a level planar surface with the mini solder balls 206 for coupling with a PCB 201, as well as accommodate, by providing clearance for, the combined height of the interconnect vias 207a and the passive device 210.

In another aspect of the present disclosure, the height of the semiconductor device and the at least one smaller conductive via coupled together may be larger than a height of the first solder ball or mini solder ball and the at least one conductive via. In this aspect with the larger height, for example, the PCB 201 may include a cavity or a recess under the die 203 (not shown) to accommodate a combined height of the interconnect vias 207a and the passive device 210 with the larger than the height of large solder balls 205a and 205b to allow a passive device with increased thickness or a stacked passive device configuration of two or more devices. In such an aspect having the cavity or recess, the PCB may have an increased thickness to accommodate the cavity or recess.

Figure 2A:
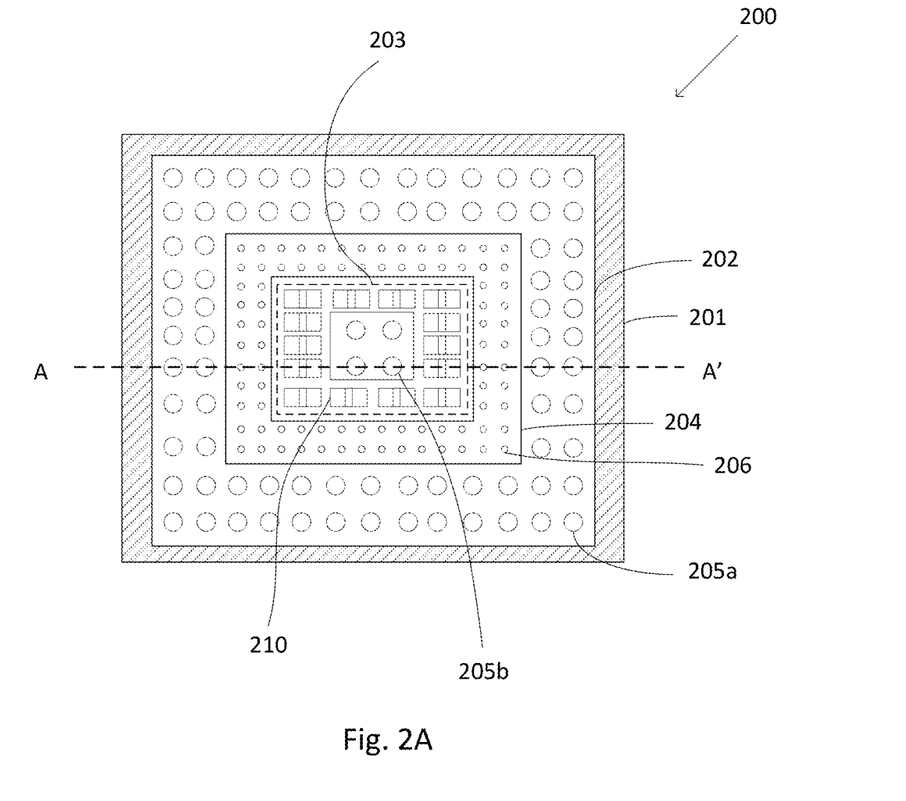
FIG. 2A shows a top view layout of the semiconductor package according to the aspect as shown in FIG. 2.

In FIG. 2A, a top view layout of the semiconductor package shown in FIG. 2 is presented. The portion of the substrate raiser 204 with the interconnect vias 207a and the mini solder balls 206 may be positioned outside the footprint of the die 203 (shown as dashed lines), while the lower step section 204b with the passive devices 210 may be positioned inside the footprint or infield area of the die 203. Due to the space taken by the step section 204a, there may be less space for the large solder balls 205b within the infield area of the substrate raiser 204.

According to the present disclosure, a semiconductor package represented in FIG. 2 may achieve a form-factor reduction through a reduced BGA pad size, e.g., from a conventional 0.12 mm2/pad to a 0.02 mm2/pad for high-speed I/O implementation. Also, the various aspects of the semiconductor package may be able to achieve an approximately 10× passive component pad size reduction, e.g., from 0.18 mm2/component to 0.018 mm2/component for a 01005 decoupling capacitor. In another aspect, signal routing 212 may be placed under the passive component footprint on the package landside of a substrate to provide additional real-estate for signal redistribution, allowing for package layer count reduction and/or a more compact form-factor.

The present disclosure also generally relates to a multi-chip semiconductor package that may have a substrate that may have top and bottom surfaces, one or more die positioned on the top surface of the substrate, a printed circuit board, a substrate raiser positioned on the bottom side of the substrate, the substrate raiser that may have at least one conductive via, a first solder ball or mini solder ball positioned on the at least one conductive via; and a plurality of second solder balls or large solder balls positioned on the bottom side of the substrate adjacent to the substrate raiser, wherein the first solder ball and the second solder balls are sized to form a level connection surface for attachment with the printed circuit board.

In the aspect shown in FIG. 3, a cross-sectional view of a multi-chip semiconductor package 300 may have a PCB 301, a substrate 302, a mounted die 303A (which is one of two dies) and substrate raisers 304a and 304b, which are positioned in the space between the PCB 301 and the substrate 302. The cross-section is taken along the A-A' line of FIG. 3A. In this aspect, the substrate raisers 304A and 304B are separated by a space under the dies; while in other aspects, large solder balls may be used to fill this space (not shown).

According to the present disclosure, the semiconductor packages may have substrate raisers that have different patterns. For example, a substrate raiser may have a rectangular shape that may appear as a one-sided "wall" on the periphery of the projected vertical footprint of a die (not shown), which may be deemed a partial perimeter according to the present disclosure. In addition, a step section may be included with the different patterns for the substrate raiser in the various aspects of the present disclosure and it is within the scope of the present disclosure to have the step section be formed within or outside the projected vertical footprint of a die.

Figure 3A:
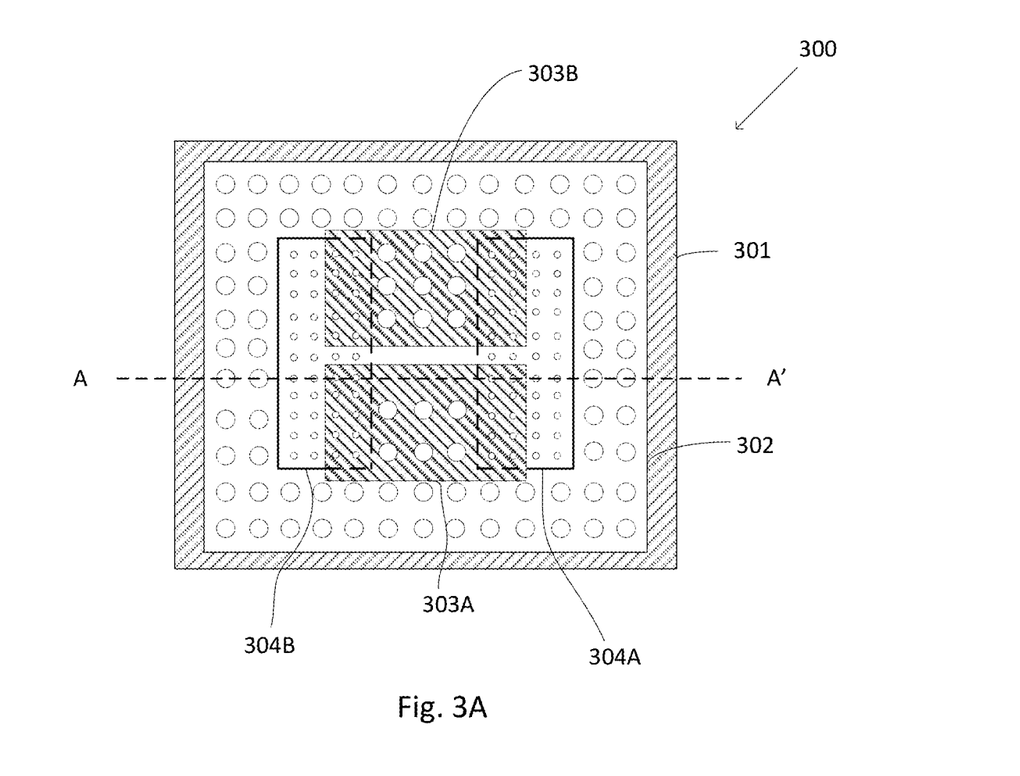
FIG. 3A shows a top view layout of the semiconductor package according to the aspect as shown in FIG. 3.

In FIG. 3A, a top view layout of the multi-chip semiconductor package according to the aspect in FIG. 3 is shown. According to an aspect, a first die 303B may be a central processing unit (CPU) and a second die 303A may be a platform controller hub (PCH) chipset, a memory device, a graphic processing unit (GPU) or a field-programmable gate array (FPGA) that are disposed on a die side of a package substrate. As shown in FIG. 3A, the substrate raisers 304A and 304B may each have a width that accommodates four rows of interconnect vias and may be partially within the vertical footprint of the dies.

The present disclosure generally further relates to a method of forming a semiconductor package that may have operations for forming a substrate, forming a raiser section on the substrate, forming at least one conductive via in the raiser section, forming a first solder ball or mini solder ball coupled to the at least one conductive via, and forming a plurality of second solder balls or large solder balls positioned on the substrate, wherein the second solder balls are sized to form a level planar connection surface with the first solder ball for attachment with a printed circuit board.

In another alternative aspect, the method has the further operations for forming a step section in the raiser section and at least one smaller conductive via in the step section by removing a portion of the raiser section by a laser or mechanical removal process and coupling a semiconductor device to the at least one smaller conductive via in the step section, wherein the portion removed from the raiser section forms a height for the semiconductor device coupled to the at least one smaller conductive via that may be less than either a height for the first solder ball and the at least one conductive via coupled together or a combined height of the height for the first solder ball and the at least one conductive via coupled together and a height for a recess provided in the printed circuit board.

FIGS. 4A through 4H provide cross-sectional views directed to an exemplary process flow for a hybrid BGA semiconductor package 400 with passive devices positioned on the bottom side of the substrate, according to an aspect that is generally similar to that shown in FIG. 2 of the present disclosure.

Figure 4A:
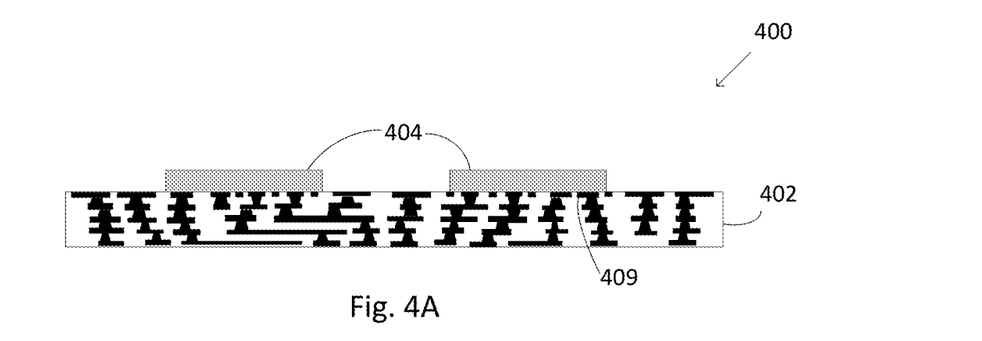
FIGS. 4A through 4H show cross-sectional views directed to an exemplary process flow for a method of making a semiconductor package with passive devices positioned on the bottom side of the substrate according to an aspect of the present disclosure.

In FIG. 4A, a package substrate 402 may be prepared according to conventional methods. The substrate 402 may have one or more rigid core layer for improved structural stability or maybe a coreless substrate package for a reduced form-factor. In an aspect of the present disclosure, a substrate raiser 404 may be formed using an injection or compression molding processing step on the "package landside" of the substrate, i.e., the side facing the PCB. It is within the scope to the present disclosure to have the substrate raiser made as part of the process for making the substrate, i.e., pre-fabrication. The substrate may have contact pads 409 that may be pre-formed on the package landside.

According to the present disclosure, the substrate raiser 404 may be a single layer or a laminate that includes at least one thermosetting polymer layer, and the material(s) used to make the substrate raiser may include epoxy resins, polyester resin, and vinyl ester. In another aspect, the substrate raiser may be made of at least one ceramic polymer layer.

Figure 4B:
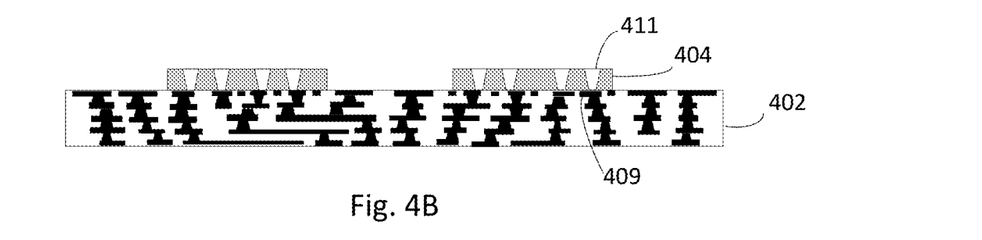

In FIG. 4B, the substrate raiser 404 has via openings 411 that may be formed by a laser or mechanical drilling processing step. It is also possible to use reactive ion etching to form the via openings. The via openings 411 may be aligned with the contact pads 409 on the substrate 402.

Figure 4C:
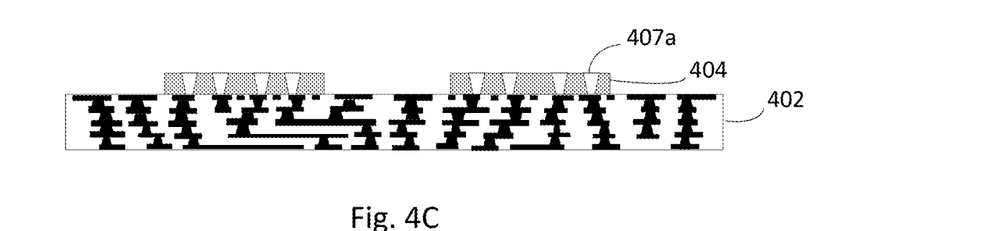

In FIG. 4C, the via openings 411 may be filled with a conductive material, e.g., copper, using an electroless and/or an electrolytic process. The primary difference between an electroless and electrolytic process is that an electroless process does not require the application of an external electrical current to drive the deposition whereas the electrolytic process does. In addition, an electroless process uses a chemical reducing agent within the solution chemistry which results in nearly uniform deposition on all surfaces that are wetted by the chemistry. According to the present disclosure, the electroless plating process may be followed by the electrolytic plating process to achieve reduced plating time with an externally supplied DC current. Following the deposition and filling of the via openings 411, the top surface of the substrate raiser 404 may be planarized to remove any excess deposited material to form the interconnect vias 407a in the substrate raiser 404.

Figure 4D:
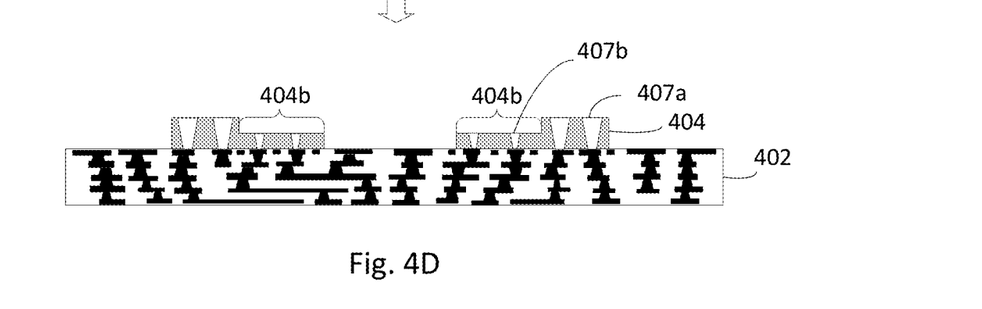

In FIG. 4D, a lower step section 404b may be formed in the substrate raiser using a laser or mechanical drilling processing step to remove portions of the substrate raiser material and the interconnect via material. The lower step section 404b may provide a support surface for connecting one or more passive devices to a die or PCB and, accordingly, the amount of material removed may depend on the height of the passive device to be placed on the step section 404b. A smaller interconnect vias 407b may be formed from the interconnect vias 407a as part of the forming of lower step section 404b. Alternatively, it is within the scope of the present disclosure to separately form the smaller interconnect vias 407b after the lower step section 404b is formed.

Figure 4E:
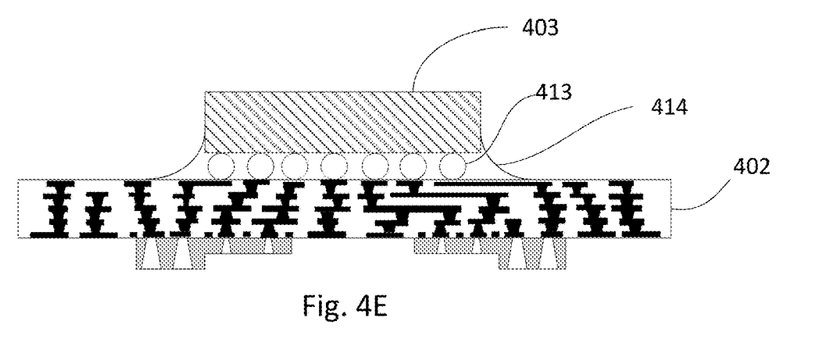

In FIG. 4E, the substrate 402 may be flipped over and a die 403 may be surface mounted to the substrate 402 by solder bumps 413 and conventional operations. In addition, an underfill 414 may be provided using either a conventional underfilling process or no-flow underfilling process to reduce the effects of thermal expansion and reduce the stress and strain on the solder bumps 413.

Figure 4F:
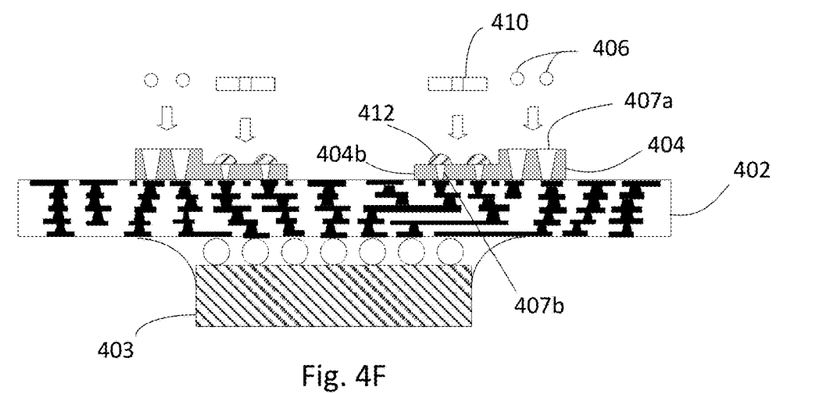

In FIG. 4F, the substrate 402 and the mounted die 403 may be flipped over and passive devices 410 may be affixed to the lower step section 404b of the substrate raiser 404 using a solder paste 412. Further assembly of the present semiconductor package may include placing mini solder balls 406 on the interconnect vias 407a. The mini solder balls 406 may be sized so that the combined height of the interconnect vias 407a and the mini solder balls 406 may be greater than the combined height of the interconnect via 407b and the passive device 410.

Figure 4G:
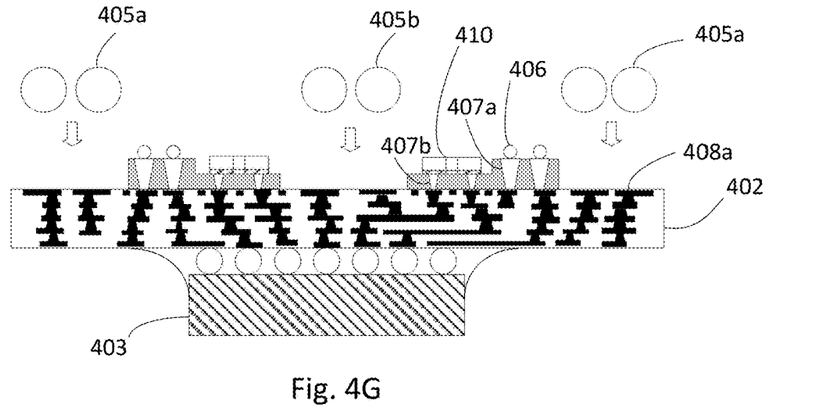

In FIG. 4G, large solder balls 405a may be placed on contact pads 408a. The large solder balls 405a may be sized to a height that may be substantially the same as the combined height of the interconnect vias 407a and the mini solder balls 406 to form a level planar surface with the mini solder balls 406 for coupling with a PCB, as well as accommodate, by providing clearance for, the combined height of the interconnect via 407b and the passive device 410.

Figure 4H:
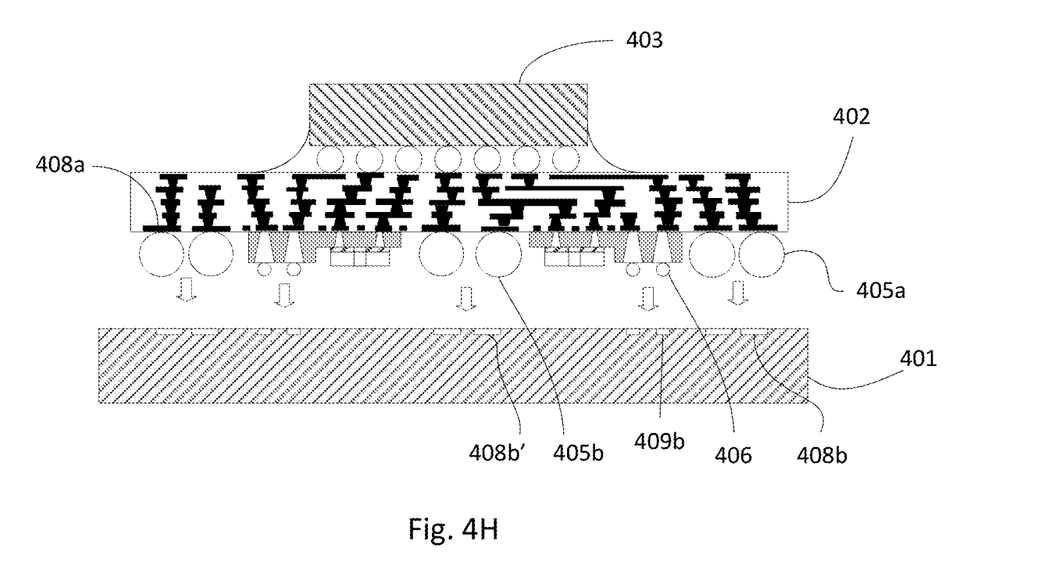

In FIG. 4H, the substrate 402 and the mounted die 403 may be flipped over yet again to be surface mounted on a PCB 401. The PCB 401 has contact pads 408b and 408b' and mini pads 409b. The large solder balls 405a and 405b may be placed on contact pads 408b and 408b', respectively, and mini solder balls 406 may be placed on mini pads 409b and coupled to complete this stage of the assembly of the present hybrid BGA semiconductor package.

The fabrication methods and the choice of materials are intended to permit the present hybrid BGA semiconductor package to reduce electrical insertion loss in the vertical interconnects used for package-to-PCB for high-speed (>40 GHz) applications and other applications. It will be apparent to those ordinary skilled practitioners that the foregoing process operations may be modified without departing from the spirit of the present disclosure.

Figure 5:
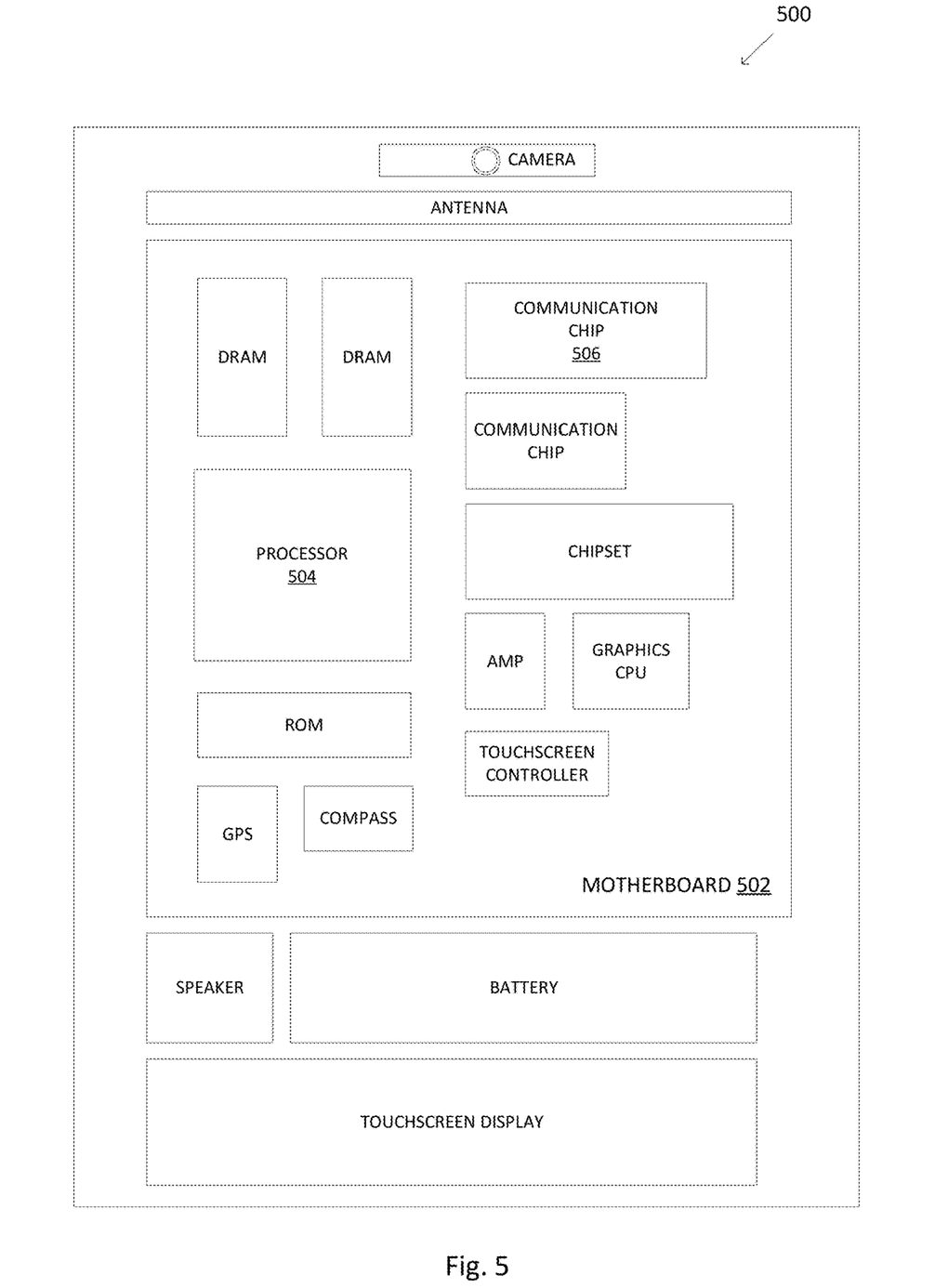
FIG. 5 shows an illustration of a computing device that includes a semiconductor package according to a further aspect of the present disclosure.

Aspects of the present disclosure may be implemented into a system using any suitable hardware and/or software. FIG. 5 schematically illustrates a computing device 500 that may include a hybrid BGA semiconductor package as described herein, in accordance with some aspects. The computing device 500 may house a board such as motherboard 502. The motherboard 502 may include a number of components, including but not limited to a processor 504 and at least one communication chip 506. The processor 504, which may have a semiconductor package according to the present disclosure, may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 504 of the computing device 500 may be packaged in a hybrid BGA semiconductor package with a substrate raiser, as described herein, and/or other semiconductor devices may be packaged together in a hybrid BGA semiconductor package with a stepped substrate raiser, as described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

EXAMPLES

Example 1 may include a substrate; a substrate raiser positioned on the substrate, the substrate raiser having one or more conductive via; a first solder ball coupled to the conductive via; and one or more second solder balls positioned on the substrate, the second solder ball having a size greater than a size of the first solder ball, wherein the first solder ball and the second solder ball extend approximately a same height above the substrate.

Example 2 may include the semiconductor package of example 1 and/or any other example disclosed herein in which the first solder ball and the second solder balls are attached to a printed circuit board.

Example 3 may include the semiconductor package of example 1 and/or any other example disclosed herein in which the first solder ball having a size that is smaller than the second solder ball.

Example 4 may include the semiconductor package of example 1 and/or any other example disclosed herein in which the first solder ball further includes a plurality of first solder balls; in which the one or more second solder ball further includes a plurality of second solder balls; and in which the one or more conductive via further includes a plurality of conductive vias.

Example 5 may include the semiconductor package of example 1 and/or any other example disclosed herein in which the substrate raiser further includes a step section having a smaller conductive via; and a semiconductor device coupled to the smaller conductive via.

Example 6 may include the semiconductor package of example 5 and/or any other example disclosed herein in which a height of the semiconductor device coupled to the smaller conductive via is less than a height of the first solder ball coupled with the conductive via.

Example 7 may include the semiconductor package of example 5 and/or any other example disclosed herein in which a height of the semiconductor device coupled to the smaller conductive via is less than a height of the first solder ball coupled with the conductive via and a height for a recess provided in a printed circuit board.

Example 8 may include the semiconductor package of example 5 and/or any other example disclosed herein in which the semiconductor device is a passive device.

Example 9 may include the semiconductor package of example 1 and/or any other example disclosed herein includes at least one die positioned over the substrate and having a vertical footprint, in which the step section of the substrate raiser is positioned inside of the vertical footprint of the die.

Example 10 may include the semiconductor package of example 9 and/or any other example disclosed herein in which the at least one die further includes two or more dies.

Example 11 may include the semiconductor package of example 9 and/or any other example disclosed herein in which the substrate raiser forms at least a partial perimeter outside the vertical footprint of the die.

Example 12 may include the semiconductor package of example 1 and/or any other example disclosed herein in which the substrate further includes a cored substrate or a coreless substrate.

Example 13 may include a method for forming a semiconductor package including forming a substrate; forming a raiser section on the substrate; forming at least one conductive via in the raiser section; forming a first solder ball coupled to the at least one conductive via; and forming a plurality of second solder balls positioned on the substrate, the second solder ball having a size greater than a size of the first solder ball, wherein the first solder ball and the second solder ball extend approximately a same height above the substrate for attachment with a printed circuit board.

Example 14 may include a method for forming a semiconductor package of example 13 and/or any other example disclosed herein including forming a step section in the raiser section and at least one smaller conductive via in the step section by removing a portion of the raiser section by a laser or mechanical removal process; and coupling a semiconductor device to the at least one smaller conductive via in the step section, in which the portion removed from the raiser section forms a height for the semiconductor device coupled to the at least one smaller conductive via that is less than either a height for the first solder ball and the at least one conductive via coupled together or a combined height of the height for the first solder ball and the at least one conductive via coupled together and a height for a recess provided in the printed circuit board.

Example 15 may include a method for forming a semiconductor package of example 13 and/or any other example disclosed herein in which forming the raiser section on the substrate includes forming a polymer layer on the substrate by an injection molding or compression molding process; and patterning the polymer layer to form at least a partial perimeter around a projected vertical footprint for a die to be placed on the substrate.

Example 16 may include a method for forming a semiconductor package of example 13 and/or any other example disclosed herein in which forming at least one conductive via in the raiser section includes forming a via opening using laser or mechanical drilling process and filling the via openings with a conductive material by an electroless or electrolytic deposition process.

Example 17 may include a computing device including a circuit board; a semiconductor package coupled with the circuit board, the circuit board including a substrate having top and bottom surfaces; one or more die positioned on the top surface of the substrate; a substrate raiser positioned on the bottom side of the substrate, the substrate raiser having at least one conductive via; a first solder ball positioned on the at least one conductive via; and a plurality of second solder balls positioned on the bottom side of the substrate adjacent to the substrate raiser, the second solder ball having a size greater than a size of the first solder ball, wherein the first solder ball and the second solder ball extend approximately a same distance from the substrate for attachment with the circuit board Example 18 may include the computing device of example 17 and/or any other example disclosed herein in which the first solder ball and the conductive via carries electrical signals of greater than 40 GHz and the second solder ball carries electrical signals of less than 40 GHz.

Example 19 may include the computing device of example 17 and/or any other example disclosed herein in which the substrate raiser includes a step section having at least one smaller conductive via; and a semiconductor device coupled to the at least one smaller conductive via, in which a height of the semiconductor device coupled to the at least one smaller conductive via is less than the first solder ball and the at least one conductive via.

Example 20 may include the computing device of example 19 and/or any other example disclosed herein including signal routing lines placed under the step section.

Example 21 may include the computing device of example 17 and/or any other example disclosed herein in which the computing device is a mobile computing device further including one or more of an antenna, a display, a touchscreen display, a touchscreen controller, a battery, a power amplifier, a global positioning system (GPS) device, a compass, a speaker, and/or a camera coupled with the circuit board.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a substrate;
a substrate raiser positioned on the substrate, the substrate raiser having one or more conductive via;
a first solder ball coupled to the conductive via; and
one or more second solder balls positioned on the substrate, the second solder ball having a size greater than a size of the first solder ball, wherein the first solder ball and the second solder ball extend approximately a same height above the substrate;
further comprising the first solder ball and the second solder balls being attached to a printed circuit board, wherein the substrate raiser further comprises:
a step section having a smaller conductive via; and
a semiconductor device coupled to the smaller conductive via.

2. The semiconductor package of claim 1, wherein the first solder ball further comprises a plurality of first solder balls;
wherein the one or more second solder ball further comprises a plurality of second solder balls; and
wherein the one or more conductive via further comprises a plurality of conductive vias.

3. The semiconductor package of claim 1, wherein a height of the semiconductor device coupled to the smaller conductive via is less than a height of the first solder ball coupled with the conductive via.

4. The semiconductor package of claim 1, wherein a height of the semiconductor device coupled to the smaller conductive via is less than a combined height of a height of the first solder ball coupled with the conductive via together and a height for a recess provided in the printed circuit board.

5. The semiconductor package of claim 1, wherein the semiconductor device is a passive device.

6. The semiconductor package of claim 1, further comprising at least one die positioned over the substrate and having a vertical footprint, wherein the step section of the substrate raiser is positioned inside of the vertical footprint of the die.

7. The semiconductor package of claim 6, wherein the at least one die further comprises two or more dies.

8. The semiconductor package of claim 6, wherein the substrate raiser forms at least a partial perimeter outside the vertical footprint of the die.

9. The semiconductor package of claim 1, wherein the substrate further comprises a cored substrate or a coreless substrate.

10. A method for forming a semiconductor package comprising:
    forming a substrate;
    forming a raiser section on the substrate;
    forming at least one conductive via in the raiser section;
    forming a first solder ball coupled to the at least one conductive via; and
    forming a plurality of second solder balls positioned on the substrate, the second solder ball having a size greater than a size of the first solder ball, wherein the first solder ball and the second solder ball extend approximately a same height above the substrate for attachment with a printed circuit board;
    further comprising attaching the first solder ball and the second solder balls to a printed circuit board;
    wherein the substrate raiser further comprises a step section having a smaller conductive via; and a semiconductor device coupled to the smaller conductive via.

11. The method for forming a semiconductor package of claim 10, further comprising:
    forming a step section in the raiser section and at least one smaller conductive via in the step section by removing a portion of the raiser section by a laser or mechanical removal process; and
    coupling a semiconductor device to the at least one smaller conductive via in the step section, wherein the portion removed from the raiser section forms a height for the semiconductor device coupled to the at least one smaller conductive via that is less than either a height for the first solder ball and the at least one conductive via coupled together or a combined height of the height for the first solder ball and the at least one conductive via coupled together and a height for a recess provided in the printed circuit board.

12. The method for forming a semiconductor package of claim 10, wherein forming the raiser section on the substrate further comprises:
    forming a polymer layer on the substrate by an injection molding or compression molding process; and
    patterning the polymer layer to form at least a partial perimeter around a projected vertical footprint for a die to be placed on the substrate.

13. The method for forming a semiconductor package of claim 10, wherein forming at least one conductive via in the raiser section further comprises:
    forming a via opening using laser or mechanical drilling process and filling the via openings with a conductive material by an electroless or electrolytic deposition process.

14. A computing device comprising:
    a circuit board;
    a semiconductor package coupled with the circuit board, the semiconductor package comprising:
    a substrate having top and bottom surfaces;
    one or more die positioned on the top surface of the substrate;
    a substrate raiser positioned on the bottom side of the substrate, the substrate raiser having at least one conductive via;
    a first solder ball positioned on the at least one conductive via; and
    a plurality of second solder balls positioned on the bottom side of the substrate adjacent to the substrate raiser, the second solder ball having a size greater than a size of the first solder ball, wherein the first solder ball and the second solder ball extend approximately a same distance from the substrate for attachment with the circuit board.

15. The computing device of claim 14, wherein the first solder ball and the conductive via carries electrical signals of greater than 40 GHz and the second solder ball carries electrical signals of less than 40 GHz.

16. The computing device of claim 14, wherein the substrate raiser further comprises:
    a step section having at least one smaller conductive via; and
    a semiconductor device coupled to the at least one smaller conductive via, wherein a height of the semiconductor device coupled to the at least one smaller conductive via is less than the first solder ball and the at least one conductive via.

17. The computing device of claim 16, further comprising signal routing lines placed under the step section.

18. The computing device of claim 16, wherein the semiconductor device is a passive device.

* * * * *